Dec. 8, 1970 E. D. MENKES 3,546,618
LOW POWER, HIGH STABILITY DIGITAL FREQUENCY SYNTHESIZER
Filed Sept. 23, 1968
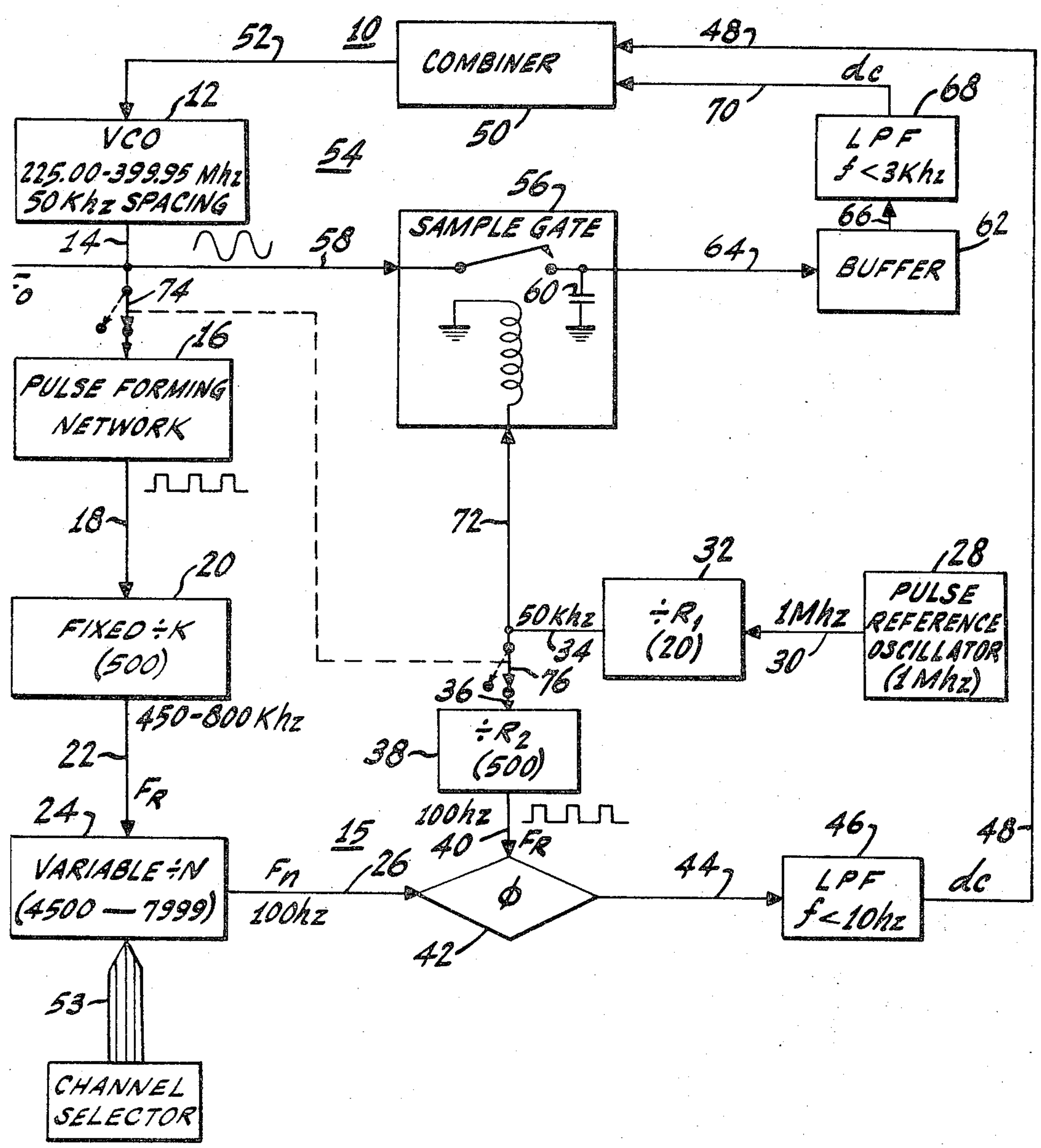
INVENTOR
ELCHANAN D. MENKES
BY Edward J. Norton
ATTORNEY 3,546,618

LOW POWER, HIGH STABILITY DIGITAL FREQUENCY SYNTHESIZER

Elchanan Dove Menkes, Westmont, N.J., assignor to RCA Corporation, a corporation of Delaware Filed Sept. 23, 1968, Ser. No. 761,759
Int. Cl. H03b 3/04
U.S. Cl. 331—10 9 Claims

ABSTRACT OF THE DISCLOSURE

A digital frequency synthesizer includes a digital frequency correction loop for a voltage controlled oscillator (VCO), the output of which is applied to a variable ÷N frequency dividing network, and then to a phase comparator which compares the output of the ÷N network with a fixed reference frequency to determine whether an error exists in the output frequency of the VCO. The output of the VCO is further applied through a pulse reference loop which includes a sampling gate that samples the magnitude of the VCO output signal at a second fixed reference rate and applies a second correction signal proportional to the change in magnitude of successive sampled values to the VCO. This latter loop maintains the VCO at the proper frequency in between the corrections made by the former loop.

This invention relates to frequency synthesis and more particularly to an improved digital frequency synthesizer.

In a digital frequency synthesizer, the output of a voltage controlled oscillator (VCO) is transformed into a chain of pulses of the VCO frequency and then applied through a variable frequency dividing network. An external reference frequency source applies a reference frequency to a phase comparator which compares the output of the variable frequency dividing network with the reference frequency and produces a correction signal that is applied to the VCO to correct its frequency. If the frequency of the VCO is at the proper value, the output of the variable dividing network and the reference signal have the proper frequency relationship, and no correction is necessary. However, where the output frequency of the VCO drifts from the desired frequency, the frequency of the variable dividing network output signal also changes and the correction signal of the phase comparator is dependent upon the frequency and phase difference between the two signals applied to it.

Due to the speed limitation of integrated circuits, it has been found necessary to first divide the frequency of the VCO output by a fixed amount prior to applying it to the variable frequency divider. Because of this, the frequency of the signals applied to the phase comparator is extremely low in comparison to the frequency of the VCO output. Thus many cycles of the VCO occur between each phase comparator correction signal. This in turn means that the VCO must be extremely stable so that it does not drift so much that the phase comparator cannot send a proper correction signal. If the loop does not have a bandwidth sufficiently large so that large frequency deviations in the VCO can be corrected, substantial incidental FM signals will occur in the output of the VCO. This, of course, leads to interference in the signal which the VCO produces.

A further problem with the above-described system is that high power is required to maintain the variable dividing network at the proper value and hence the system is not readily adaptable for portable use.

A second method of maintaining a stable frequency from the VCO is to use a pulse reference loop. In this instance the sinusiodal output of the VCO is sampled at a fixed rate which must be an exact sub-multiple of the desired VCO frequency. As long as the desired frequency is maintained, the value of each sample will remain constant. However, if the VCO frequency drifts, the value of successive samples will change, and a correction signal proportional to this change will be produced, applied to, and correct the VCO. One major problem with this approach is that the VCO can lock-in at any integral multiple of the sampling frequency. Thus it is possible to receive no correction signal where the VCO drifts an amount equal to the sampling rate. To overcome this problem, it is necessary to use extremely sensitive voltage tuning in the VCO.

It is an object of this invention to provide an improved frequency synthesizer which alleviates the above problems.

In accordance with the invention a voltage controlled oscillator and a reference oscillator are provided. Between the output of the voltage controlled oscillator and the controlled input thereof, two phase lock loops are provided. In the first loop the frequency of the voltage controlled oscillator is corrected at a rate determined by a first reference frequency. In the second loop the voltage controlled oscillator frequency is corrected at a rate determined by a second reference frequency which is faster than the first reference frequency.

An embodiment of the invention is hereinafter described in detail in connection with the single figure which shows one embodiment of an improved frequency synthesizer using this invention.

In the figure an improved frequency synthesizer circuit 10 is shown which includes a voltage controlled oscillator 12 that produces a sinusoidal output signal $F_o$ of a specific frequency on line 14. This signal $F_o$ is applied around a digital correction loop 15 which includes a pulse forming network 16 that translates the sinusoidal signal into a chain of pulses having the same frequency $f_o$ as signal $F_o$. The chain of pulses is applied through line 18 to a fixed ÷K network 20 which applies a signal $F_k$ of frequency $f_k$ on line 22. The signal on line 22 is applied to a variable ÷N frequency dividing network 24 which further divides the signal by an amount N and applies a pulse chain signal $F_n$ of frequency $f_n$ on the line 26. The fixed ÷K network 20 is included in loop 15 because programmable variable ÷N networks, such as network 24, which are made from low cost, low-power microelectronic integrated circuits, operate at slow speeds compared to UHF frequencies. Thus the frequency of the signal applied to them must be reduced to about three megahertz or below.

Pulse reference oscillator 28 applies a chain of pulses of a reference frequency through line 30 to a fixed ÷$R_1$ frequency dividing network 32 which provides a chain of pulses of frequency $f_s$ to line 34. The output of network 32 is applied through lines 34 and 36 to a second fixed ÷$R_2$ frequency dividing network 38 which applies a signal $F_r$ having a frequency $f_r$ to line 40.

When VCO 12 is oscillating at the proper frequency, the signals on lines 26 and 40 will have the identical frequency and a fixed phase relationship. If the frequency of VCO 12 drifts, a corresponding drift in the frequency of the signal $F_n$ on line 26 will occur, resulting in a different phase relationship between the pulse appearing on line 26 and the corresponding one appearing on line 40. Signals $F_n$ on line 26 and $F_r$ on line 40 are applied to phase comparing circuit 42 which compares the two signals and applies a correction signal to line 44, the magnitude of which is dependent upon the difference in the phase relationship between successive pulses occurring on line 26 and the corresponding successive ones occurring on line 40. The signal on line 44 is applied through a low pass filter 46, through line 48, through combiner 50, and through line 52 to VCO 12 to return it to the proper frequency.

If a different output frequency from VCO 12 is desired, the divisor variable ÷N network 24 can be changed by programming predetermined signals to it over the channel selector path 53. When the divisor is changed, the signal on line 26 no longer equals the signal on line 40 and a correction signal is sent out over line 44 and applied to VCO 12. This signal changes the frequency at which the VCO oscillates so that $F_n$ again equals $F_r$. In this manner, VCO 12 may be made to operate at many different stable frequencies. The difference between adjacent frequencies, or the channel spacing, will be the frequency of signal $F_n$ times the divisor K, or $f_n \times K$. Thus, to make the number of channels large the channel spacing must be small, so therefore, $f_n$ must be small. However, in this situation, signal $F_o$ is not corrected for frequency drift often enough, and large drifts may cause incidental FM to occur in $F_o$.

As an example, a system operating in the UHF frequency range will be described. VCO 12 oscillates at any frequency between 225.00 mHz. to 399.5 mHz. with a 50 kHz. spacing between each stable frequency. Fixed ÷K frequency divider 20 will be set to divide the frequency of the signal applied to it by 500. Variable ÷N frequency divider 24 will have to be able to divide the frequency of $F_k$ by any divisor between 4500 and 7999 such that a 100 Hz. signal appears on line 26. As an example, if the stable frequency of 250 mHz. is desired from VCO 12, ÷N network 24 will be set to divide by 5000. In this situation $f_k$ is 500 kHz. and $f_n$ is 100 Hz. If a pulse reference oscillator oscillates at 1 mHz., ÷$R_1$ network 32 should be a ÷20 network and ÷$R_2$ network 38 should be a ÷500 network. In this case, signal $F_r$ will also be 100 Hz. Low pass filter 46 will filter out any frequency of the correction signal over 10 Hz. As can be seen, phase comparator 42 would correct the VCO at a rate of 100 Hz., yet VCO 12 oscillates at a minimum of 225 mHz. This means that VCO 12 is corrected once for every two million two hundred fifty thousand cycles. Therefore the VCO will have to be very stable and thus expensive.

In order to increase the rate of correction of the VCO output signal, a second phase locked loop 54 is provided. This loop includes sample gate 56 to which the sinusoidal signal $F_o$ is applied through line 58. Gate 56 samples the magnitude of signal $F_o$ for a short time which is less than ½ the time period of one cycle of $F_o$. Capacitor 60 is charged up to a voltage corresponding to the sampled magnitude. This voltage is applied to buffer 62 through line 64 and then through line 66, low pass filter 68, which blocks frequencies over 3 kHz., combiner 50 and line 52 to correct VCO 12. Buffer 68 may be for instance a FET transistor or some other high impedance device to prevent capacitor 60 from appreciably discharging between samples. On the other hand, buffer 68 may be a second sampling network containing a larger time constant. Combiner 50 may be a simple adding circuit, or may contain summing amplifiers.

In order that loop 54 maintains VCO 12 at the proper lock-in frequency, it is necessary that the frequency at which gate 56 samples $F_o$ be an exact submultiple of the lock-in frequency of VCO 12. Thus, for the example given above, where the channel spacing of VCO 12 was 50 kHz., the rate of sampling would be 50 kHz. Since the output frequency $f_s$ of ÷$R_1$ network 32 in the above example was 50 kHz., this signal can be applied through line 72 to gate 56 and used to control the rate of sample. Thus signal $F_o$ is being corrected fifty thousand times a second, or five hundred times as often as when loop 54 was not used.

Once VCO 12 becomes locked-in at the required frequency, it is possible to disconnect loop 15 by changing the position of switches 74 and 76, since loop 54 can maintain VCO 12 at the proper frequency as long as no channel change is required. Thus considerable power saving results due to the fact that continuous power need not be applied to variable ÷N network 24. In the alternative, loop 15 may be switched in and out of the system periodically to insure the proper channel is being used with some power savings still resulting.

What is claimed is:

1. A frequency synthesizer comprising, first means, including a voltage controlled oscillator, for producing at an output thereof an output signal having an output frequency which can deviate from a desired frequency, said output frequency being under the control of a frequency correction signal applied to an input thereof to minimize said frequency deviation, second means, including a reference oscillator, for providing at a first output thereof a first reference signal having a first reference frequency, said first reference frequency being a submultiple of said desired frequency, and at a second output thereof a second reference signal having a second reference frequency, first and second phase locked loops, each coupled from said output to said input of said first means, said first loop including third means having applied thereto said first reference signal for sampling the magnitude of said output signal at a rate equal to said first reference frequency, for comparing the value of successive sampled magnitudes of said output signal and for providing a first portion of said correction signal in accordance with the then existing relationship between said output frequency and said first reference frequency, and said second loop including fourth means having applied thereto said second reference signal for providing a second portion of said correction signal in accordance with the then existing relationship between said output frequency and said second reference signal.

2. The invention according to claim 1 wherein said second reference frequency is a submultiple of said desired frequency.

3. The invention according to claim 2 wherein said second reference frequency is a submultiple of said first reference frequency.

4. The invention according to claim 1 wherein said desired frequency can be any frequency over a selected frequency range which is an exact multiple of said first reference frequency.

5. The invention according to claim 1 wherein said first means includes combining means for combining said first portion and said second portion of said correction signal into said correction signal.

6. A frequency synthesizer comprising, first means, including a reference oscillator, for providing a first reference signal having a first reference frequency at an output thereof, said first reference signal being a chain of pulses, first frequency dividing means to which said first reference signal is applied for providing at an output thereof a second reference signal having a second reference frequency which is a submultiple of said first reference frequency, said second reference signal being a chain of pulses, second means, including a voltage controlled oscillator for providing at an output thereof, an output signal having an output frequency which can deviate from a desired frequency, said output frequency being under the control of a frequency correction signal applied to an input of said oscillator to minimize said frequency deviation, second frequency dividing means to which said output signal is applied for providing at an output thereof, a divided signal having a divided frequency which is a submultiple of said output frequency, said divided signal being a chain of pulses, a certain position on a pulse of said divided signal and a certain position on a corresponding pulse of said second reference signal occurring at a fixed phase only when said output frequency is the same as said desired frequency, phase comparing means to which said divided signal and said second reference signal are applied for providing a first portoin of said frequency correction signal, said portion being dependent upon the time between said position on said pulse of said divided signal and said position on said pulse of said second reference signal, third means to which said output signal is applied for sampling the magnitude of said output signal at a rate equal to said first reference frequency, for thereafter comparing the value of successive sampled magnitudes, and for providing a second portion of said frequency correction signal at an output thereof which is dependent upon the change in value of said compared sampled magnitudes, and combining means for combining said first portion and said second portion of said frequency correction signal into said frequency correction signal.

7. The invention according to claim 6 wherein said desired frequency can be any frequency within a prescribed frequency range that is an exact multiple of said first reference frequency.

8. The invention according to claim 6 wherein said second frequency dividing means includes a pulse forming network, said output signal being applied thereto, for providing a chain of pulses at a frequency corresponding to said output frequency at an output terminal thereof, and a frequency dividing network to which said chain of pulses at said pulse forming network output terminal is applied for providing said divided signal at an output thereof, the divisor of said frequency dividing network being variable.

9. The invention according to claim 6 wherein said second reference frequency is the same as said desired frequency divided by the divisor of said second frequency dividing means.

References Cited

UNITED STATES PATENTS

| | | | |
|---|---|---|---|
| 3,023,370 | 2/1962 | Waller | 331—14X |
| 3,130,375 | 4/1964 | Rotier et al. | 331—10X |
| 3,375,461 | 3/1968 | Ribour et al. | 331—10X |

ROY LAKE, Primary Examiner

S. H. GRIMM, Assistant Examiner

U.S. Cl. X.R.

331—14, 18, 25

UNITED STATES PATENT OFFICE
CERTIFICATE OF CORRECTION

Patent No. 3,546,618 Dated December 8, 1970

Inventor(s) Elchanan D. Menkes

It is certified that error appears in the above-identified patent and that said Letters Patent are hereby corrected as shown below:

Column 2, line 2 Change "sinusiodal" to read --sinusoidal--.

Column 3, line 25 change "399.5" to read --399.95--.

Signed and sealed this 29th day of June 1971.

(SEAL)
Attest:

EDWARD M.FLETCHER,JR.
Attesting Officer

WILLIAM E. SCHUYLER, JR.
Commissioner of Patents